(12) United States Patent
Bai et al.

(10) Patent No.: US 6,326,700 B1
(45) Date of Patent: Dec. 4, 2001

(54) LOW PROFILE SEMICONDUCTOR PACKAGE AND PROCESS FOR MAKING THE SAME

(75) Inventors: Jinchuan Bai, Sanchung; Chung-Che Tsai, Taipei, both of (TW)

(73) Assignee: United Test Center, Inc., Hsin-Chu (TW)

( * ) Notice: Subject to any disclaimer, the term of this patent is extended or adjusted under 35 U.S.C. 154(b) by 0 days.

(21) Appl. No.: 09/639,202

(22) Filed: Aug. 15, 2000

(51) Int. Cl.[7] ..................................................... H01L 23/29
(52) U.S. Cl. ........................ 257/790; 257/782; 257/778; 438/126; 438/108
(58) Field of Search .................................... 257/783, 782, 257/787, 778, 790; 438/126, 127, 118, 108

(56) References Cited

U.S. PATENT DOCUMENTS

| | | | |
|---|---|---|---|
| 5,977,624 | * | 11/1999 | Heo et al. . |
| 6,150,730 | * | 11/2000 | Chung et al. . |
| 6,177,721 | * | 1/2001 | Suh et al. . |
| 6,218,731 | * | 4/2001 | Huang et al. . |
| 6,252,298 | * | 6/2001 | Lee et al. . |

* cited by examiner

*Primary Examiner*—Sheila V. Clark
(74) *Attorney, Agent, or Firm*—Anderson, Kill & Olick, P.C.

(57) ABSTRACT

A low-profile semiconductor device is disclosed which includes a substrate having a base layer formed with at least a hole and a plurality of conductive traces arranged on the base layer. A semiconductor die is attached to the base layer of the substrate opposite to the conductive traces and electrically connected to the conductive traces by a plurality of first conductive elements passing through the hole of the base layer. A plurality of second conductive elements are arrayedly connected to the terminal of each of the conductive traces for providing externally electrical connection to the semiconductor die. The semiconductor die is encapsulated by a first encapsulant formed on the surface of the substrate on which the semiconductor die is mounted. A second encapsulant is formed on the surface of the substrate on which the conductive traces are arranged to completely encapsulate the conductive traces, first conductive elements and the hole. Meanwhile, the second encapsulant is formed to encapsulate the second conductive elements in such a manner that the bottom ends of the second conductive elements are exposed to and flush with the bottom surface of the second encapsulant.

18 Claims, 5 Drawing Sheets

LOW PROFILE SEMICONDUCTOR PACKAGE AND PROCESS FOR MAKING THE SAME

FIELD OF THE INVENTION

The present invention relates to semiconductor devices and, more particularly, to a semiconductor device in which a semiconductor die mounted on a substrate is electrically coupled to external devices through arrayed conductive elements implanted on the bottom surface of the substrate.

BACKGROUND OF THE INVENTION

Ball grid array (BGA) semiconductor devices have become a mainstream package product lately because arrayed solder balls implanted on the bottom surface of a substrate to which a semiconductor die is adhered, are capable of providing increased I/O connections to the semiconductor die with external devices such as printed circuit board, when compared to conventional leadframe-based semiconductor devices. Further, the pitch between any two adjacent solder balls can be effectively reduced such that a substrate can accommodate a larger number of solder balls thereon. As a result, such BGA semiconductor device can meet the requirement in I/O connection for a high density semiconductor die.

During wire bonding of the above-mentioned conventional BGA semiconductor devices for electrically coupling the semiconductor die to the substrate onto which the semiconductor die is attached a wire bonding tool is used to first ball bond the free end of a bonding wire to a bond pad on the semiconductor die, and then stitch bond the opposite end of the bonding wire to the substrate. Right after the ball bond at the bond pad on the semiconductor die is made, the wire bonding tool is to pull the bonding wire upward to a preset height and thereafter outwardly downward to the bonding area on the substrate. This makes the top point of the wire loop formed by the bonding wire higher than the semiconductor die so that the resin encapsulant that encapsulates the semiconductor die and gold wires should have a thickness sufficient to cover the top point of the wire loop in order to prevent the bonding wires from exposure. As a result, the thickness of the encapsulated semiconductor device can not be effectively reduced.

In order to resolve the drawback in thickness of the above-mentioned conventional BGA semiconductor devices, a BGA semiconductor device with a thin profile is disclosed, as shown in FIG. 12. This BGA semiconductor device 1 includes a substrate 11 for a semiconductor die 10 to be mounted thereon and having a hole 110 formed therewith. The hole 110 is for bonding wires 12 to pass therethrough for providing electrical connection between the semiconductor die 10 and conductive traces 111 formed on the substrate 11. After wire bonding of the bonding wires 12 is completed, a lower encapsulant 13 is formed to encapsulate the bonding wires 12 and hole 110. Since a part of the wire loop of the bonding wires 12 is positioned within the substrate 11 and merely another part of the wire loop of the bonding wires 12 extends beyond the bottom surface of the substrate 11, the height h of the lower encapsulant 13 protruding from the bottom surface of the substrate 11 can be controlled to be lower than the height H of the solder balls 14 implanted on the bottom surface of the substrate 11. Therefore, the thickness of the upper encapsulant 15 only needs to be sufficient to encapsulate the semiconductor die 10 without the consideration of the height of wire loop of the bonding wires 12. As a result, the semiconductor device 1 is lower in height than the above-mentioned conventional BGA semiconductor device.

Although the semiconductor device 1 shown in FIG. 12 is capable of effectively reducing the overall height, it still has the following drawbacks. First, in order to prevent the conductive traces 111 on the substrate 11 from being exposed to the atmosphere, it is necessary to provide a solder mask layer 112 on the bottom surface of the substrate 11 to completely cover the conductive traces 111. The application of the solder mask layer 112 thus increases the cost for making the substrate 11. Also, the use of solder mask layer 112 results in hygroscopicity concern and to cope with this problem the cost for the manufacture of the substrate 11 further increases. Further, the semiconductor device 1 is of a low profile such that, when being mounted by conventional methods such as surface mounting technology to external devices such as printed circuit board, the semiconductor device 1 tends to warp as the coefficient of thermal expansion of the substrate 11 is different from that of the upper encapsulant 15. Warpage of the semiconductor device 1 accordingly causes the semiconductor die 10 to delaminate from the substrate 11 and adversely affect the electrical connection with external devices.

Moreover, to avoid warpage from occurrence the thickness of the substrate 11 may be increased to resist thermal stress; nevertheless this not only increases the cost of the substrate 11 but also increases the overall height. Meanwhile, during electrical performance testing of the semiconductor device 1, the tips of testing probes (not shown) do not usually have complete contact with the solder balls 14 as the lower ends of the solder balls 14 are spherical in contour. When the contact of the testing probes with the solder balls is incomplete, the test result is accordingly misleading. Besides, the semiconductor device 1 requires expensive ball-implantation machines to implant solder balls 14, making the overall packaging cost difficult to be reduced. Also, after the solder balls 14 are implanted onto the substrate 11 the planarity of the bottom ends of solder balls 14 is difficult to maintain, thus resulting in poor quality of the electrical connection between the semiconductor device 1 and the external device.

SUMMERY OF THE INVENTION

It is therefore an objective of this invention to provide a low-profile semiconductor device that its overall thickness can be effectively reduced.

Another objective of this invention is to provide a low-profile semiconductor device that the thickness of and the cost for making the substrate of the semiconductor device can be reduced.

Still another objective of this invention is to provide a low-profile semiconductor device that the substrate of the semiconductor device needs not be coated with solder mask, thus reducing the cost for making the substrate.

Yet another objective of this invention is to provide a low-profile semiconductor device, which can eliminate warpage of the semiconductor device such that the occurrence of delamination between the semiconductor die and the substrate can be effectively prevented.

Still another objective of this invention is to provide a low-profile semiconductor device, which can improve the accuracy of testing of electrical performance.

Yet another objective of this invention is to provide a low-profile semiconductor device, which can be electrically connected to an external device in a quality-assured way than the prior art.

In accordance with the foregoing and other objectives, the present invention proposes a novel low-profile semiconductor device. The semiconductor device comprises a substrate having a base layer and a plurality of conductive traces formed on the base layer; a semiconductor die with an active surface and an opposing inactive surface and being mounted on the base layer of the substrate via the active surface; a plurality of first conductive elements that pass through at least a hole formed in the base layer of the substrate for electrically coupling the semiconductor die to the conductive traces on the substrate; a plurality of arrayed second conductive elements arranged on and bonded to the terminal of each conductive trace for providing externally electrical connection to the semiconductor die; a first encapsulant formed on the surface of the substrate on which the semiconductor die is mounted, so as to encapsulate the semiconductor die; and a second encapsulant formed on the surface of the substrate on which the conductive traces are arrayed, so as to completely encapsulate the conductive traces, the first conductive elements and the hole, the second encapsulant being formed in such a manner that the second conductive elements are encapsulated with the lower ends thereof exposed to and flush with the bottom surface of the second encapsulant.

The second conductive elements may be solder balls or lumps of metallic materials made of cooper, aluminum, copper alloy, aluminum alloy or tin/lead alloy. When solder balls are used as the second conductive elements a conventional solder ball-implantation machine can be used to implant the solder balls to the terminals of the conductive traces of the substrate. In the case of using lumps of metallic material, the lumps can be formed to bond to conductive traces of the substrate by conventional printing or plating methods.

The semiconductor die can be completely encapsulated in the first encapsulant or expose its inactive surface to the exterior of the first encapsulant. Meanwhile, a heat spreader can be attached to the inactive surface of the semiconductor die to improve heat dissipation of the semiconductor device in accordance with this invention. To avoid height increase due to the installation of a heat spreader, the heat spreader made of metallic material can be directly bonded to the base layer of the substrate and accommcondate the semiconductor die in an opening formed in the center of the heat spreader.

In the case that only one hole is formed in the substrate, the suitable semiconductor die is one having central pads thereon. When there are two opposing holes parallelly disposed in the substrate, it is suitable to use a semiconductor die having double-sided pads arranged on its active surface. When there are four holes arranged in a rectangular form, it is suitable to use a peripheral-pad type semiconductor die.

BRIEF DESCRIPTION OF THE DRAWINGS

This invention can be more fully understood by reading the following detailed description of the preferred embodiments, with reference made to the accompanying drawings, wherein.

DETAILED DESCRIPTION OF THE PREFERRED EMBODIMENT

First Embodiment

Figure 1:
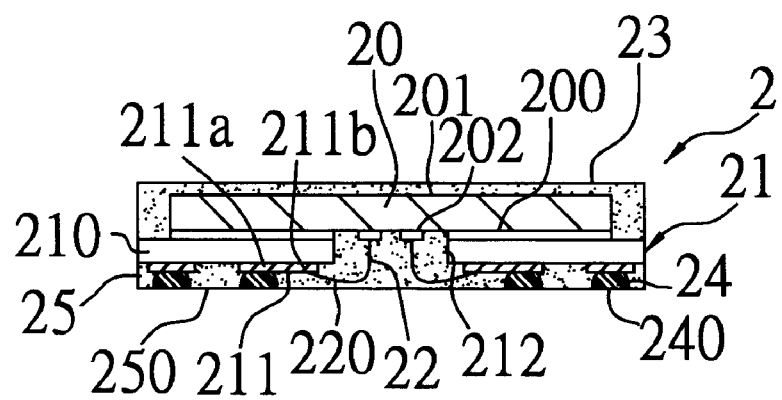
FIG. 1 is a cross-sectional view of a semiconductor device in accordance with a first embodiment of the present invention.

FIG. 1 shows a cross-sectional view of a semiconductor device in accordance with the first embodiment of the present invention. As shown in the drawing, the semiconductor device 2 of the first embodiment includes a semiconductor die 20, a substrate 21 for the semiconductor die 20 to be mounted thereon, a plurality of gold wires 22 electrically coupling the semiconductor die 20 to the substrate 21, an upper encapsulant 23 formed on the upper surface of the substrate 21 for encapsulating the semiconductor die 20, a plurality of arrayed solder balls 24 implanted on the lower surface of the substrate 21 for providing externally electrical connection to the semiconductor die 20, and a lower encapsulant 25 formed on the lower surface of the substrate 21.

The semiconductor die 20 has an active surface 200 on which electronic components and electrical circuits are formed, and an opposing inactive surface 201. In the center of the active surface 200 there are formed with a plurality of bond pads 202 arranged in two parallel rows. The semiconductor die 20 is adhered with its active surface 200 to a pre-determined die-attachment area on the substrate 21 via an adhesive such as silver paste or polyimide tape. In order to reduce thermal stress resulted from the substrate 21 against the semiconductor die 20 when undergoing a temperature change during a temperature cycle, the adhesive is preferably made of a thermoplastic or thermoplastic resin material.

The substrate 21 includes a base layer 210 and a plurality of conductive traces 211 formed on the bottom surface of the base layer 210. Materials suitable for the base layer 210 include, for example, epoxy resins, polyimide resins, bis-maleimidetriazine resins, FR4 resins, epoxy resin glass, ceramic material or thermal resistant paper. The semiconductor die 20 is mounted with the adhesive onto the base layer 210. Generally the conductive traces 211 are formed from copper foil and each of them has a terminal end and a corresponding initial end. At the terminal end of each conductive traces 211 a ball pad 211a is formed for the solder ball 24 to implant thereon, while a bond pad 211b is formed at the initial end for a gold wire 22 to bond thereon. As the conductive traces 211 of the substrate 21 are hermetically covered by the lower encapsulant 25, no solder mask layer needs to be coated thereon, thus allowing the manufacturing cost of the substrate 21 to be reduced. Meanwhile, on both the top and bottom surfaces of the substrate 21 the upper encapsulant 23 and lower encapsulant 25 are respectively formed in such a manner that the substrate 21 is interposed between the upper encapsulant 23 and the lower encapsulant 25. This permits the thermal stress resulted from the upper encapsulant 23 against the substrate 21 to be offset by that resulted from the lower encapsulant 25 against the substrate 21 during a temperature cycle, for the reason that the upper and lower encapsulants 23 and 25 have the same coefficient of thermal expansion (CTE). As a result, warpage of the packaged product can be effectively eliminated and accordingly occurrence of delamination at the interface between the substrate 21 and the semiconductor die 20 can be reduced. With the ease of warpage and delamination concern, the yield and reliability of the semiconductor device 2 can thus be improved over the prior art. In addition, because the substrate 21 is interposed between the upper encapsulant 23 and the lower encapsulant 25 this combined structure is of an improved mechanical strength than the prior art. As the semiconductor device 2 of this invention has an improved mechanical strength over the prior art, the substrate 21 used therefor may be reduced in thickness to thereby benefit the height reduction of the semiconductor device 2, as well as the cost reduction of the substrate 21.

A hole 212 is formed in the base layer 210 of the substrate 21 such that after the semiconductor die 20 is mounted to the base layer 210 of the substrate 20, the bond pads 202 on the active surface 200 of the semiconductor die 20 are exposed in the hole 212 for the gold wires 22 to pass therethrough so as to electrically connect the bond pads 202 on the semiconductor die 20 to the bond pads 211b of the conductive traces 211.

The upper encapsulant 23 and the lower encapsulant 25 are formed from conventional encapsulating materials such as epoxy resin. After the lower encapsulant 25 is formed on the bottom surface of the substrate 21 it completely encapsulates the conductive traces 211, gold wires 22 and the hole 212 so that the conductive traces 211, gold wires 22 and the active surface 200 of the semiconductor die 20 are hermetically sealed. Alternatively, the lower encapsulant 25 may be formed in two steps. A first step is to encapsulate the gold wires 22 and the active surface 200 of the semiconductor die 20 so as to form a first resin body, prior to the implantation of the solder balls 24. The next step is to form a second resin body over the conductive traces 211 of the substrate 21 after the solder balls 24 are bonded to the ball pads 211a of the conductive traces 211, allowing the conductive traces 211 to be completely encapsulated and the solder balls 24 to be partly cover by the second resin body. Accordingly, the first and second resin bodies in combination form the lower encapsulant 25.

Figure 2:
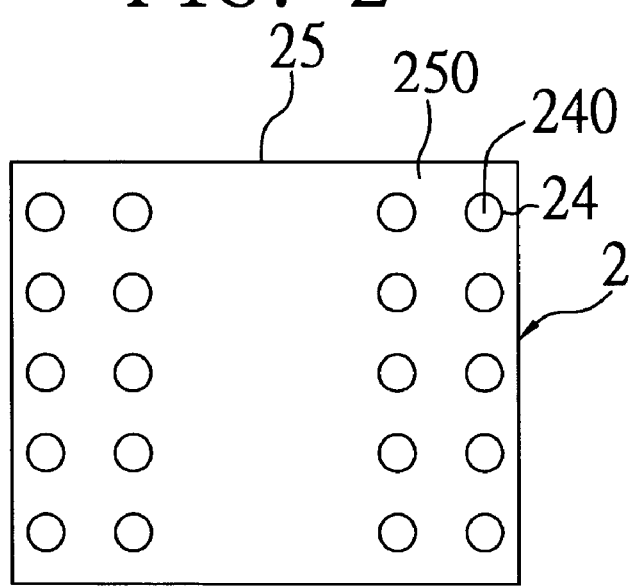
FIG. 2 is a plan view of the semiconductor device shown in FIG. 1.

Meanwhile, the lower encapsulant 25 is formed in such a manner that the bottom ends 240 of the solder balls 24 are exposed to the bottom surface 250 of the lower encapsulant 25, as shown in FIG. 2, and the bottom ends 240 of the solder balls 24 are adapted to be planner with the bottom surface 250 of the lower encapsulant 25. This makes the planarity of the plane formed by the bottom ends 240 of the solder balls 24 and the bottom surface 250 of the lower encapsulant 25 satisfactory to provide the semiconductor device 2 with a quality-assured electrical connection to external device such as a printed circuit board. Furthermore, because the bottom end 240 of each of the solder balls 24 is formed to be flat rather than spherical as in prior art, the tips of the testing probes of a testing tool are allowed to come into complete contact with the bottom ends 240 of solder balls 24 during a testing process. As a result, the accuracy of the testing can be satisfactorily improved. In addition, to further enhance the planarity of the bottom surface of the semiconductor device 2 of the present invention, an additional grinding treatment of the bottom surface 250 of the lower encapsulant 25 and the bottom ends 240 of the solder balls 24 may be adopted. By doing so, the thickness of the lower encapsulant 25 can also be further reduced to the extent that the top point 220 of the wire loop of the gold wires 22 would not be exposed to the bottom surface 250 of the lower encapsulant 25, thus making the overall height of the semiconductor device 2 of the present invention satisfactorily lower than the prior art.

FIGS. 3A–3H are diagrams depicting the procedural steps used to manufacture the low-profile semiconductor device in accordance with the first embodiment of the present invention shown in FIG. 1.

Figure 3A:
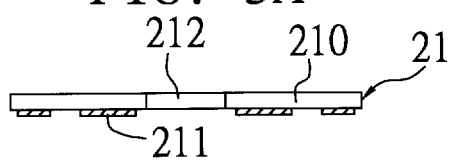
FIGS. 3A–3H are diagrams depicting a manufacturing process of the semiconductor device in accordance with the first embodiment of the present invention.

As shown in FIG. 3A, a substrate 21 is provided which is formed with a base layer 210 and a plurality of conductive traces 211 patterned on the base layer 210. The base layer 210 is also formed with a hole 212 in the center region.

Figure 3B:
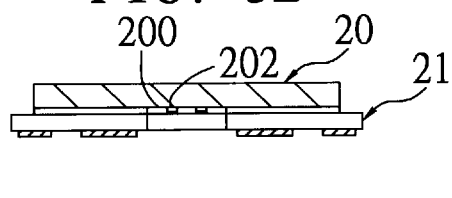

As shown in FIG. 3B, a die-bonding step is performed to mount a semiconductor die 20 with silver paste or polyimide tape to a predetermined die-attachment area on the substrate 21. The semiconductor die 20 has an active surface 200 with a plurality of bond pads 202 formed thereon such that the bond pads 202 on the semiconductor die 20 are exposed in the hole 212 of the substrate 21, after the semiconductor die 202 is adhered to the substrate 21 via its active surface 200.

Figure 3C:
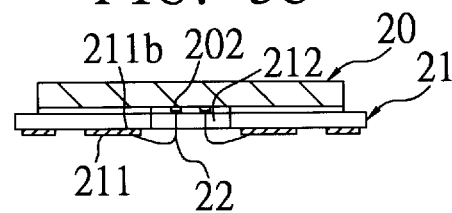

As shown in FIG. 3C a wire-bonding step is performed to electrically couple the bond pads 202 on the semiconductor die 20 to the bond pads 211b formed on the ends of the conductive traces 211 with a plurality of gold wires 22 through the hole 212 of the substrate 21.

Figure 3D:
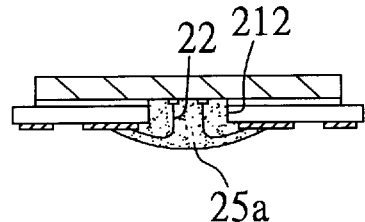

As shown in FIG. 3D, after wire-bonding step is completed, melted encapsulating resin is introduced into the hole 212 by conventional glob top methods to form a first resin body 25a. The resin body 25a is formed to encapsulate the gold wires 22 and to fill the hole 212 so as to keep the active surface 200 of the semiconductor die 20 and the gold wires 22 from the ambient.

Figure 3E:
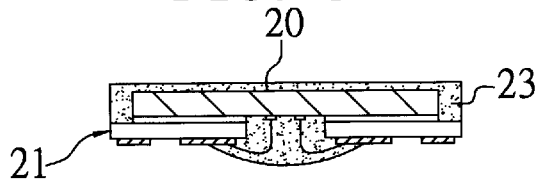

As shown in FIG. 3E, the combined structure of the substrate 21 and semiconductor die 20 of FIG. 3D is placed into an encapsulating mold (not shown) to perform a transfer molding step. This allows melted encapsulating resin to solidify on the upper surface of the substrate 21 to form an upper encapsulant 23 that encapsulates the semiconductor die 20. Of course, other molding methods, such as conventional injection molding or pour molding, may also be utilized.

Figure 3F:
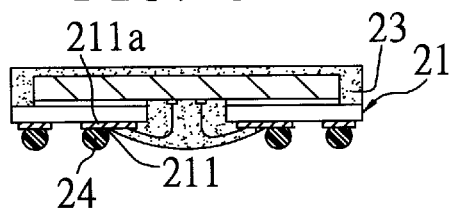

As shown in FIG. 3F, upon the formation of the upper encapsulant 23, a plurality of solder balls 24 are implanted on the ball pads 211a formed on another ends of the conductive traces 211 on the substrate 21. Since solder ball implantation is conventional, no detailed description thereto will be given here.

Figure 3G:
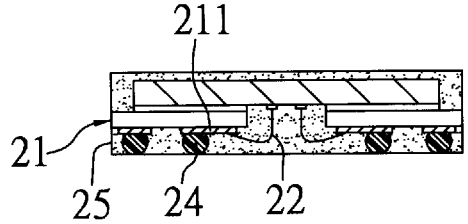

As shown in FIG. 3G, upon the completion of solder ball implantation a traditional transfer molding method is performed to form a second resin body over the conductive traces 211 of the substrate 21 and the first resin body 25a. Therefore, the first and second resin bodies in combination are formed into the lower encapsulant 25 which is capable of sealing the conductive traces 211, gold wires 22 and the active surface 200 of the semiconductor die 20 from the ambient. The lower encapsulant 25 can also be formed by conventional printing, coating or glob top methods without any particular restriction.

Figure 3H:
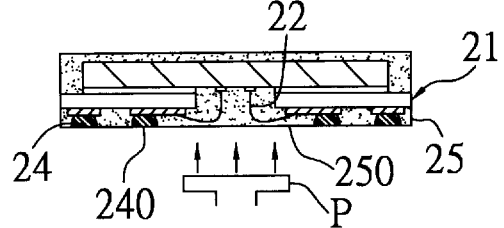

Finally, as shown in FIG. 3H, a conventional grinding machine P is used to grind the solder balls 24 and the lower encapsulant 25 in a direction toward the substrate 21 to reduce the thickness of the lower encapsulant 25 and the height of the solder balls 24 to the extent that the top point of the wire loop of the gold wire 22 is still lower than the bottom ends 240 of the solder balls 24 as well as the bottom surface 250 of the lower encapsulant 25. As soon as the grinding treatment is completed, the bottom ends 240 of the solder balls 24 are exposed to and flush with the bottom surface 250 of the lower encapsulant 25. This completes the manufacture of the semiconductor device 2 according to the invention, as shown in FIG. 1. As a result, the grinding treatment provides the semiconductor device 2 with a bottom surface having a well-defined planarity and an overall height lower than the prior art.

Besides, the step of encapsulating the gold wires 22 with encapsulating resin 25a as shown in FIG. 3D can be omitted as the encapsulation of the gold wires 22 may be performed with the encapsulation of the conductive traces 211 on the substrate 21 as shown in FIG. 3G. Accordingly, the manufacturing process of the present invention can be simplified.

Figure 4A:
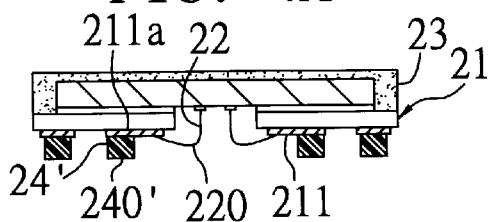
FIGS. 4A–4B are diagrams depicting another manufacturing process of the semiconductor device in accordance with the first embodiment of the present invention.
Figure 4B:
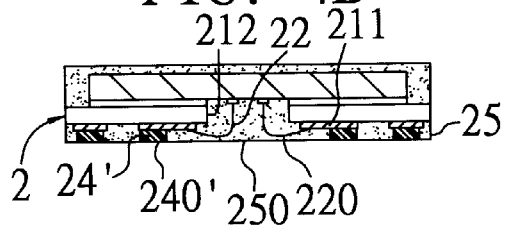

FIGS. 4A and 4B are diagrams depicting another manufacturing process for the low-profile semiconductor device in accordance with the first embodiment of the present invention. The procedural steps of this alternative process prior to solder ball implantation are the same as those described in the above and shown in FIGS. 3A–3E; therefore no further description thereto will be given here. The description for this alternative process will thus start from the procedural step subsequent to the formation of the upper encapsulant 23. Also, structural elements which are the same as those described in the above-mentioned process are labeled with the same reference numerals for simplification purpose.

As shown in FIG. 4A, after formation of the upper encapsulant 23 on the upper surface of the substrate 21 a plurality of lumps 24' made of tin/lead alloy are formed on the ball pad 211a of the conductive trace 211 by conventional screen printing. Since the lumps 24' can be formed on the substrate 21 by printing (or plating) methods, the lumps 24' are capable of being accurately controlled to a desired height, thus allowing the lumps 24' to be only slightly higher than the top point 220 of the wire loop of the gold wire 22 and to be flat in the bottom ends 240'. Further, as the lumps 24' are formed by printing or plating methods, there requires no expensive solder ball-implantation machine to implant the solder balls and thereby the manufacture cost can be reduced.

As shown in FIG. 4B, after the lump 24' are formed, a transfer molding is to be performed to form the lower encapsulant 25 that completely encapsulates the conductive traces 211, gold wires 22 and the hole 212. The lower encapsulant 25 is formed in such a manner that the lumps 24' are encapsulated by the lower encapsulant 25 with the bottom ends 240' of the lumps 24' exposed to and flush with the bottom surface 250 of the lower encapsulant 25. Meanwhile, since the height of the lumps 24 is controlled to be slightly higher than the top point 220 of the wire loop of the gold wires 22, the lower encapsulant 25 is sufficient to cover the gold wires 22 to prevent them from exposure. As a result, the lower encapsulant 25 requires no post-grinding treatment to reduce its thickness after formation.

Figure 5:
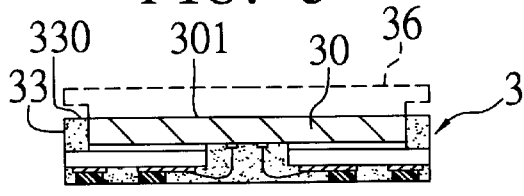
FIG. 5 is a cross-sectional view of a semiconductor device in accordance with a second embodiment of the present inventions.
Figure 12:
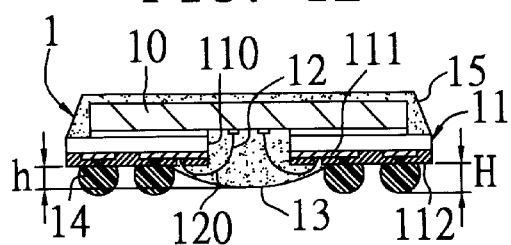
FIG. 12 is a cross-sectional view of a conventional semiconductor device.

FIG. 5 is a cross-sectional view of a low-profile semiconductor device in accordance with a second embodiment of the present invention. The semiconductor device 3 of the second embodiment is substantially the same as that described in the first embodiment, except that after formation of the upper encapsulant 33 on the upper surface of the substrate 31, the inactive surface 301 of the semiconductor die 30 is exposed to the top surface 330 of the upper encapsulant 33. With the inactive surface 301 of the semiconductor die 30 exposed to the atmosphere, it enables the heat generated by the semiconductor die 30 to be directly dissipated from its inactive surface 301 to the atmosphere. Therefore, the heat dissipation efficiency is enhanced. In addition, because the top surface 330 of the upper encapsulant 33 is planar with the inactive surface 301 of the semiconductor die 30, the overall height of the semiconductor device 3 is lower than that disclosed in the first embodiment. Furthermore, in order to further improve heat dissipation, a heat spreader 36, shown by the dashed line in FIG. 5, may be directly attached to the exposed inactive surface 301.

Figure 6:
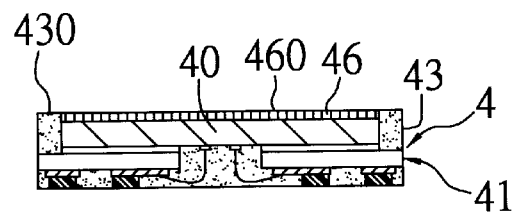
FIG. 6 is a cross-sectional view of a semiconductor device in accordance with a third embodiment of the present invention.

FIG. 6 is a cross-sectional view of a low-profile semiconductor device in accordance with a third embodiment of the present invention. The semiconductor device 4 of the third embodiment has a structure substantially the same as that of the first embodiment, except that on the inactive surface 401 of the semiconductor die 40 a heat spreader 46 can be mounted. This allows the heat spreader 46 to be embedded in the upper encapsulant 43 with the upper surface 460 of the heat spreader 46 exposed to the top surface 430 of the upper encapsulant 46, after formation of the upper resin encapsulant 43 on the substrate 41. Accordingly, heat generated by the semiconductor die 40 can be dissipated into the atmosphere directly from the upper surface 460 of the heat spreader 46. Of course, the heat spreader 46 can also be completely embedded in the upper encapsulant 43.

Figure 7:
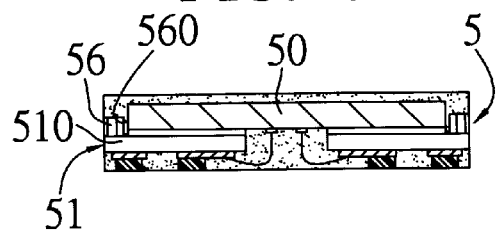
FIG. 7 is a cross-sectional view of a semiconductor device accordance with a fourth embodiment of the present invention.

FIG. 7 is a cross-sectional view of a low-profile semiconductor of device in accordance with a fourth embodiment of the present invention. The semiconductor device 5 of the fourth embodiment has a structure substantially the same as that described in the first embodiment, except that a heat spreader 56 is adhered to the base layer 510 of the substrate 51. The heat spreader 56 has an opening 560 formed in the center so that the semiconductor die 50 can be mounted on the base layer 510 of the substrate 51 through the opening 560. This allows the overall height of the semiconductor device 5 to be the same as that of the first embodiment, as the addition of the heat spreader 56 to the substrate 51 does not contribute height increase to the semiconductor device 5.

Figure 8:
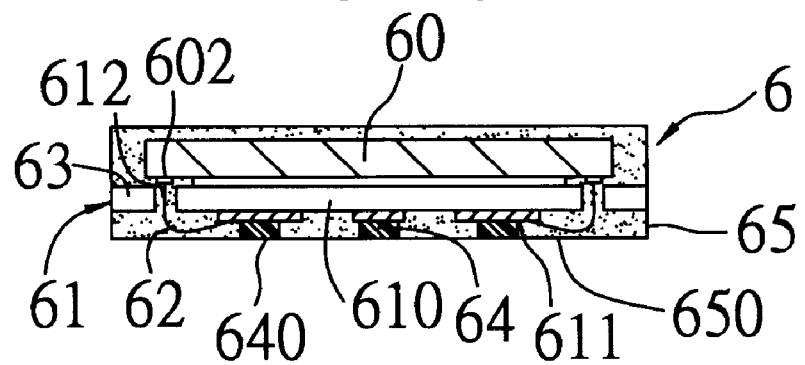
FIG. 8 is a cross-sectional view of a semiconductor device in accordance with a fifth embodiment of the present invention.
Figure 9:
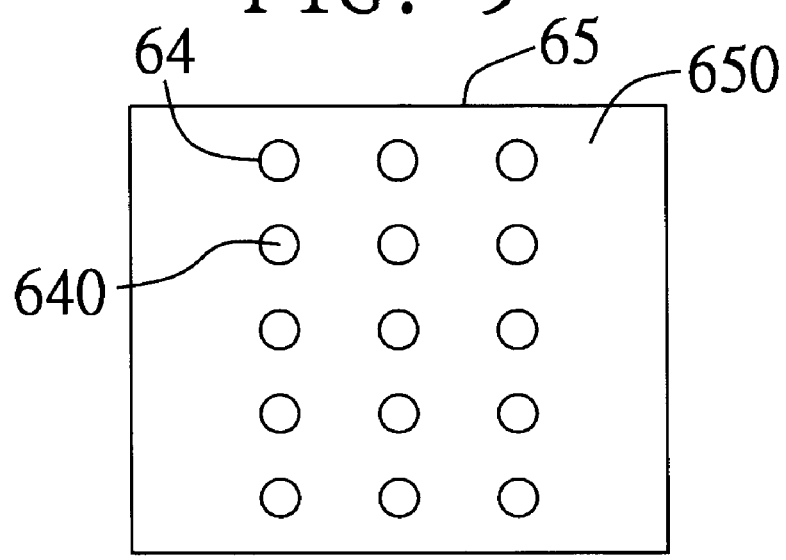
FIG. 9 is a plan view of the semiconductor device shown in FIG. 8.

FIG. 8 is a cross-sectional view of a semiconductor device in accordance with a fifth embodiment of the present invention. The semiconductor device 6 of the fifth embodiment has a structure substratially the same as that described in the first embodiment, except that the semiconductor die 60 in the semiconductor device 6 is of double-sided pads. In other to fit with the double-sided pad type semiconductor die 60 there are formed with two holes 612 parallelly arranged in the substrate 61. As a result, after the semiconductor die 60 is mounted on the base layer 610 of the substrate 61, the bond pads 602 on each side of the semiconductor die 60 are exposed in the corresponding hole 612 of the substrate 61 for the gold wires 62 to respectively pass through to electrically couple the semiconductor die 60 to the conductive traces 611. Of course, the inactive surface of the semiconductor die 60 can be exposed to the top surface of the upper encapsulant 63 after the upper encapsulant 63 is formed. Such a structure can be easily derived from FIG. 5 such that the drawing therefor is omitted. After the manufacture of the semiconductor device 6 is completed, the bottom ends 640 of the lumps 64 are arrayed in a matrix and exposed to the bottom surface 650 of the lower encapsulant 65, as shown in FIG. 9.

Figure 10:
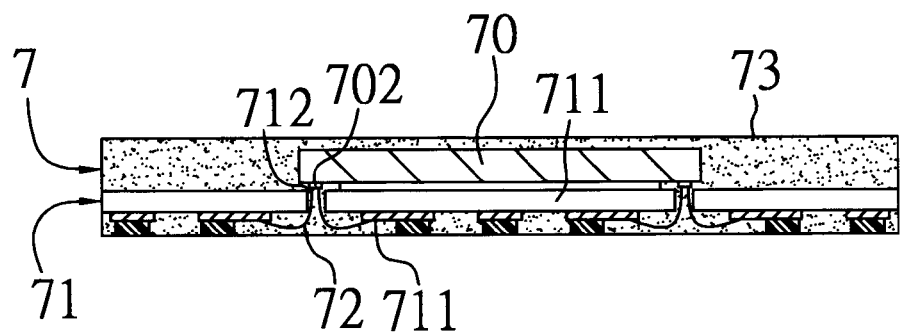
FIG. 10 is a cross-sectional view of a semiconductor device in accordance with a sixth embodiment of the present invention.
Figure 11:
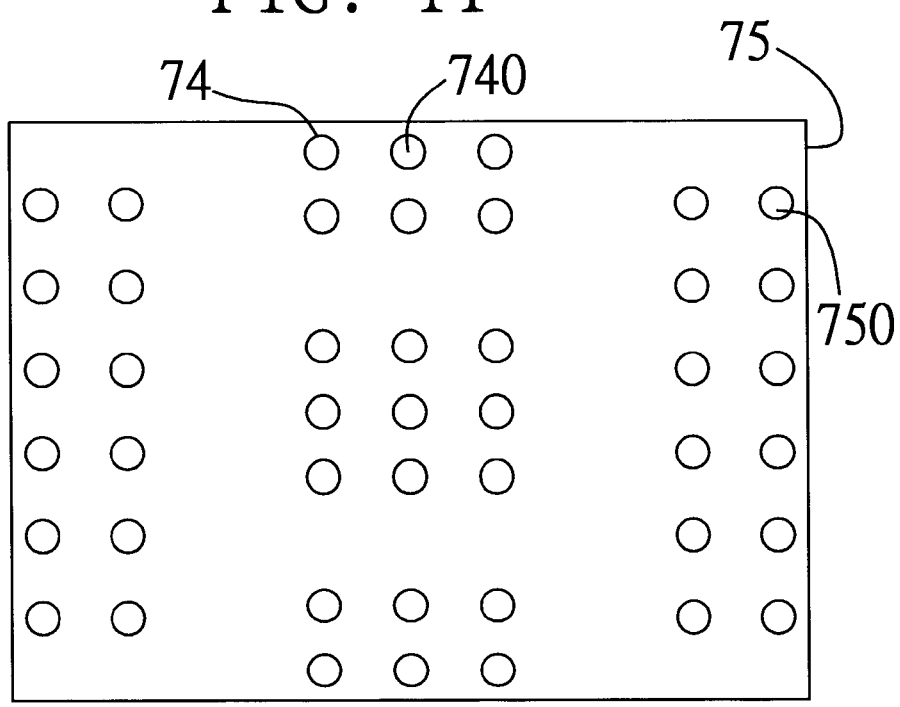
FIG. 11 is a plan view of the semiconductor device shown in FIG. 10.

FIG. 10 is a cross-sectional view of a low-profile semiconductor device in accordance with a sixth embodiment of the present invention. The semiconductor device 7 of the sixth embodiment has a structure substantially the same as that described in the first embodiment, except that the semiconductor die 70 is of the peripheral-pad type. The substrate 71 are formed with four holes 712 in a rectangular arrangement such that after a semiconductor die 70 is mounted on the base layer 710 of the substrate 71 the bond pads 702 formed on each side of the semiconductor die 70 are exposed in the corresponding hole 712 in the substrate 71. This allows gold wires 72 to pass therethrough to electrically couple the semiconductor die 70 to conductive traces 711 on the substrate 71. Similarly, the inactive surface of the semiconductor die 70 can be exposed to the top surface of the upper encapsulant 73, and a heat spreader (not shown) can be attached to the exposed inactive surface to increase heat dissipation efficiency. After the manufacture of the semiconductor device 7 is completed, the bottom end 740 of each of the lumps 74 is exposed to the bottom surface 750 of the lower encapsulant 75 as shown in FIG. 11.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A low-profile semiconductor device, comprising:
    a substrate having a base layer and a plurality of conductive traces formed on the base layer, the base layer being formed with at least a hole;
    a semiconductor die having an active surface and an opposing inactive surface, the semiconductor die being mounted on the base layer of the substrate via the active surface thereof;
    a plurality of first conductive elements passing through the hole in the substrate for electrically coupling the semiconductor die to the conductive traces on the substrate;
    a plurality of second conductive elements arranged on terminals of the conductive traces for electrically connecting the semiconductor die to external devices;
    a fist encapsulant formed on the substrate to encapsulate the semiconductor die; and
    a second encapsulant formed over the conductive traces of the substrate so as to encapsulate the conductive traces, the first conductive elements and the hole; wherein the second encapsulant is formed in such a manner that the second conductive elements are encapsulated by the second encapsulant with bottom ends of the second conductive elements being exposed to and flush with a bottom surface of the second encapsulant.

2. The low-profile semiconductor device of claim 1, wherein said first conductive elements are gold wires.

3. The low-profile semiconductor device of claim 1, wherein said second conductive elements are solder balls.

4. The low-profile semiconductor device of claim 1, wherein said second conductive elements are lumps.

5. The low-profile semiconductor device of claim 4, wherein said lumps are formed by printing methods.

6. The low-profile semiconductor device of claim 4, wherein said lumps are formed by plating methods.

7. The low-profile semiconductor device of claim 4, wherein the material used to form said lumps are selected from the group consisting of copper, aluminum, copper alloy, aluminum alloy and tin/lead alloy.

8. The low-profile semiconductor device of claim 1, wherein the inactive surface of said semiconductor die is exposed to a top surface of said upper encapsulant.

9. The low-profile semiconductor device of claim 1, wherein the inactive surface of said semiconductor die is covered by said upper encapsulant.

10. The low-profile semiconductor device of claim 1, wherein said substrate is formed with two holes parallelly arranged.

11. The low-profile semiconductor device of claim 1, wherein said substrate is formed with four holes in a rectangular arrangement.

12. The low-profile semiconductor device of claim 1, further comprising a heat spreader attached to the inactive surface of said semiconductor die.

13. The low-profile semiconductor device of claim 1, further comprising a heat spreader attached to the base layer of said substrate and formed with an opening for said semiconductor die to be received therewithin.

14. A method for manufacturing a low-profile semiconductor device, comprising the steps of:
    preparing of a substrate having a base layer and a plurality of conductive traces formed on the base layer, wherein said base layer is formed with at least a hole;
    mounting a semiconductor die on a predetermined die-attachment area on the base layer of said substrate;
    electrically connecting said semiconductor die to said conductive traces on the substrate via a plurality of first conductive elements through the hole of said substrate;
    forming a first encapsulant on said substrate to encapsulate said semiconductor die;
    bonding a plurality of arrayed second conductive elements on terminals of the conductive traces of said substrate; and
    forming a second encapsulant over the conductive traces of said substrate to completely encapsulate the conductive traces, the first conductive elements and the hole, wherein the second encapsulant is formed in such a manner that the second conductive elements are encapsulated by the second encapsulant with bottom ends of said second conductive elements exposed to and flush with a bottom surface of said second encapsulant.

15. The method of claim 14, further comprising a step of grinding said second encapsulant and second conductive elements so as to reduce the thickness of said second encapsulant and the heights of said second conductive elements, subsequent to the formation of said second encapsulant.

16. The method of claim 14, wherein said second conductive elements are solder balls.

17. The method of claim 14, wherein said second conductive elements are lumps.

18. The method of claim 14, further comprising a step of pre-encapsulation of said first conductive elements with encapsulating resin to hermetically seal said first conductive elements, subsequent to the step of electrically coupling said semiconductor die to the conductive traces of the substrate via said first conductive elements.

* * * * *